(12) United States Patent
Whitney et al.

(10) Patent No.: US 7,306,027 B2
(45) Date of Patent: Dec. 11, 2007

(54) FLUID-CONTAINING COOLING PLATE FOR AN ELECTRONIC COMPONENT

(75) Inventors: Bradley R. Whitney, Boscawen, NH (US); Randolph H. Cook, Gilford, NH (US); John R. Cennamo, Gilford, NH (US); Sukhvinder S. Kang, Rochester, MN (US)

(73) Assignee: Aavid Thermalloy, LLC, Concord, NH (US)

( * ) Notice: Subject to any disclaimer, the term of this patent is extended or adjusted under 35 U.S.C. 154(b) by 410 days.

(21) Appl. No.: 10/883,450

(22) Filed: Jul. 1, 2004

(65) Prior Publication Data

US 2006/0000579 A1   Jan. 5, 2006

(51) Int. Cl.
*F28F 7/00* (2006.01)
*H05K 7/20* (2006.01)
(52) U.S. Cl. ............... 165/80.4; 165/170; 165/104.21
(58) Field of Classification Search ............... 165/80.4, 165/104.33, 166, 168, 170, 153, 104.21, 165/104.26; 361/699, 700, 702
See application file for complete search history.

(56) References Cited

U.S. PATENT DOCUMENTS

| | | | | |
|---|---|---|---|---|
| 1,549,619 A | * | 8/1925 | Steenstrup | ................ 165/170 |
| 2,348,020 A | * | 5/1944 | Norris | ....................... 165/167 |
| 3,476,175 A | * | 11/1969 | Plevyak | ................ 165/104.21 |
| 4,971,144 A | * | 11/1990 | Gibson et al. | .............. 165/170 |
| 5,390,732 A | * | 2/1995 | Bathla | ........................ 165/153 |
| 2001/0030043 A1 | * | 10/2001 | Gleisle et al. | .............. 165/167 |
| 2002/0179288 A1 | * | 12/2002 | Ishida et al. | ........... 165/104.26 |
| 2004/0011512 A1 | * | 1/2004 | Noda et al. | ............ 165/104.26 |

FOREIGN PATENT DOCUMENTS

DE        4438393 A1 *  5/1996
WO   WO 8403354 A1 *  8/1984

* cited by examiner

*Primary Examiner*—Tho Duong
(74) *Attorney, Agent, or Firm*—Cohen Pontani Lieberman & Pavane LLP

(57) ABSTRACT

A fluid-containing cooling plate includes a bottom plate, a top plate, and metal wire or tubing formed into a circuit and sandwiched between the plates to form a chamber. The wire is plated or otherwise coated with a brazeable or solderable alloy which bonds it to the plates when the assembly is heated, thereby sealing the chamber. To make a two-phase cooling plate, slugs of plated metal are placed in the chamber and are bonded to the plates to provide support against collapse. The chamber is provided with a wicking structure, and is partially filled with an evaporable fluid via an inlet. A partial vacuum is then drawn, and the inlet is closed off. To make a single-phase cooling plate, wire partitions serving as baffles are provided in lieu of the slugs. These partitions can be arranged to provide a serpentine flow path between the inlet and an outlet, and are likewise plated with an alloy which melts to bond them to the plates.

23 Claims, 5 Drawing Sheets

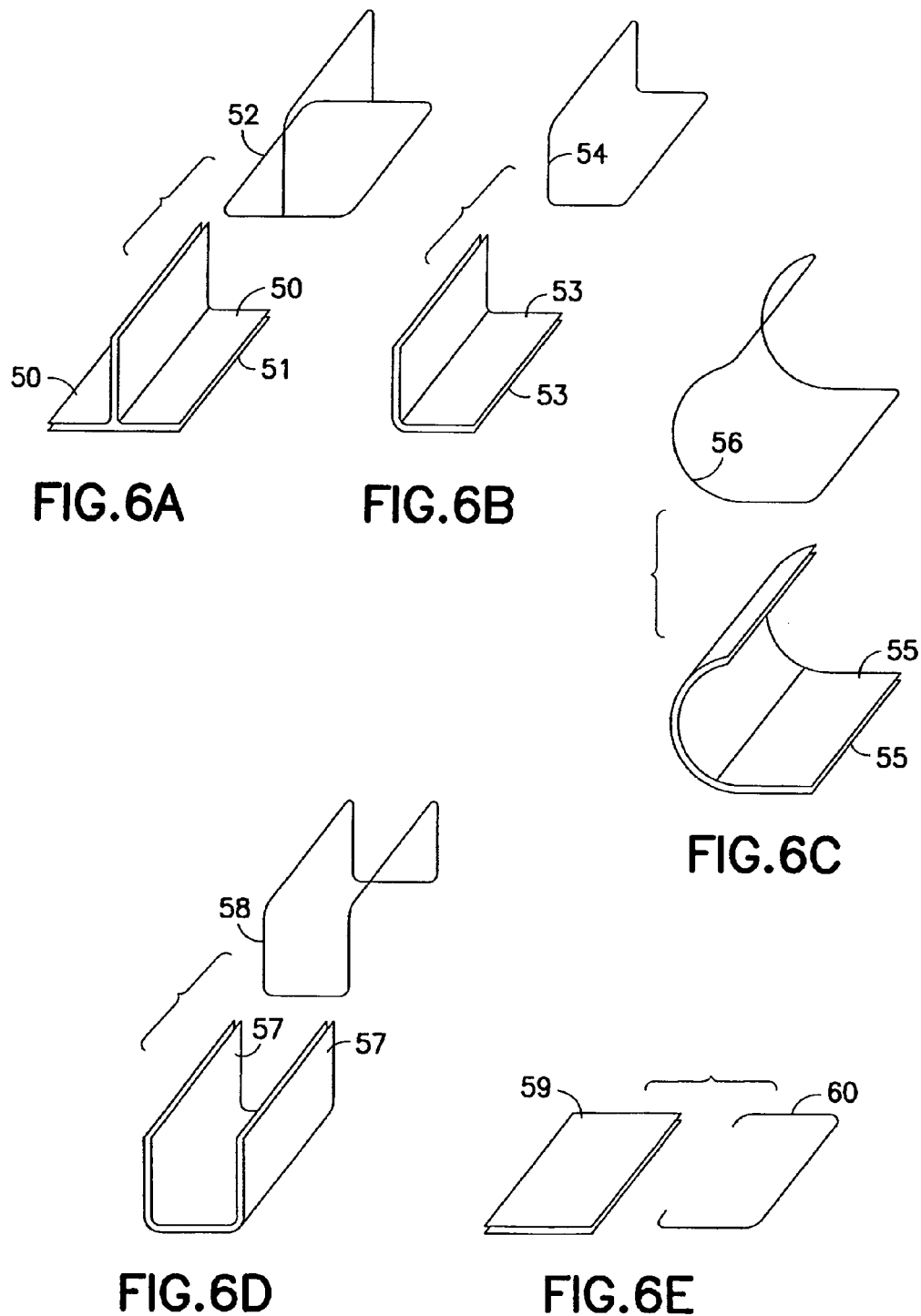

FLUID-CONTAINING COOLING PLATE FOR AN ELECTRONIC COMPONENT

BACKGROUND OF THE INVENTION

1. Field of the Invention

The present invention relates to a cooling assembly which may be embodied as a two-phase evaporator-type cooling plate having a sealed chamber containing a fluid in both liquid and gaseous phases, as a single-phase cooling plate having a chamber through which a fluid in the liquid phase is circulated, or as a pumped cooling plate having an inlet which receives liquid and an outlet for vapor. The invention also relates to a method for manufacturing cooling plates of these types.

2. Description of the Related Art

A cooling plate, as that term is used herein, refers to a component whose length and width are significantly larger than its thickness, and which is used to cool a heat source applied to one of its major surfaces. Cooling plates having a chamber containing a working fluid which assists in heat transfer are well known. The fluid may be present in both liquid and gaseous phases, or only in a liquid phase. It is important that the chamber be sealed so that neither liquid nor vapor are transferred to the surrounding environment, and so that ambient atmosphere is not admitted into the chamber, which could result in the loss of heat transfer properties.

Cooling plates of the prior art typically have a top and a bottom which are fixed together to form a chamber which contains the liquid and/or gas. Typically, one of the top and the bottom is a deep drawn stamping to which a flat plate is brazed or otherwise sealingly fixed to form the chamber. However the cost of tooling for a drawn part can be high, and is not justified for short runs or prototypes. Alternatively, the top and/or the bottom may be machined with a cavity to which the other part is fixed to form the chamber. This is labor intensive and results in large amounts of scrap, and can only be justified for prototypes.

SUMMARY OF THE INVENTION

An object of the invention is to provide a fluid-containing cooling plate which can be adapted to both single-phase and two-phase embodiments, and has a low manufacturing cost.

According to the invention, this object is achieved by a cooling assembly including a first metal plate having a planar surface and an opposed surface; a second metal plate having a planar surface and an opposed surface, wherein the planar surface of the second plate faces the planar surface of the first plate and is parallel to the planar surface of said first plate; and an elongate material consisting of one of a wire and a tube formed into a circuit sandwiched between and bonded to the planar surfaces to form a chamber. An inlet is provided for introducing a working fluid into the chamber, and may also be used for drawing a vacuum in the chamber after introducing the fluid.

According to a preferred embodiment, the elongate material is a wire plated with a brazeable or a solderable alloy, the wire being bonded to the bottom plate and the top plate by brazing or soldering. During manufacture, the wire is formed into a circuitous wall which is placed against the planar or inside surface of the bottom plate near its periphery, whereupon the top plate is placed against the wall and the plates are heated until the brazeable alloy melts and forms the bonds.

Alternatively, the elongate material may be bonded to the plates by welding, diffusion bonding, or induction heating. If induction heating is to be used, at least one of the components is selected to be electrically or magnetically dissipative so that heat is generated when it is exposed to an oscillating magnetic field. One suitable arrangement would employ an elongate material having an iron-based, e.g. steel, core which is first coated or clad with copper and subsequently plated with a brazing alloy. The core may be of a material which is more electrically or magnetically dissipative than the material of the plates, such that the core can be heated by exposure to the oscillating electric field or to an oscillating magnetic field. Exposure to the oscillating magnetic field generates currents which heat the steel to the melting point of the brazing alloy. This offers the advantage that heating may be confined to the area where it is needed.

In order to provide a two-phase closed cooling plate, a vacuum is created in the chamber after the fluid is added, and the inlet is sealed off. For additional structural support between the plates, plated wire slugs of like diameter as the wire forming the wall are placed in the chamber and brazed or soldered to the planar surfaces simultaneously with the circuitous wall. These slugs serve as pedestals or spacers which support the plates against collapse toward each other under vacuum conditions, and likewise prevent expansion away from each other under high pressure. To promote evaporation in the chamber of a two-phase cooling plate, a wicking structure is preferably provided in the chamber. The wicking structure may be fixed to the inside surface of the bottom plate, spaced from the outer wall, and provided with holes to distance it from the slugs. This prevents the brazeable alloy on the slugs from bleeding into the wicking structure. It also assures that the slugs are bonded directly to the plates.

In order to provide a single-phase cooling plate through which working fluid in liquid form is circulated, a wire partition which routes the fluid through the chamber is provided between the inlet and an outlet. Like the wire slugs, the partition wire has essentially the same transverse dimension as the wire forming the peripheral wall of the chamber, and is plated with a brazeable or solderable alloy so that it can bond to the plates simultaneously with the wire wall during heating.

The structure and manufacturing method of the invention offer a number of advantages over the prior art. First, the elongate material such as wire or tubing which is used to form the wall can be bent to approximately follow the perimeter of the plates with low cost tooling that can be made quickly. Second, the use of plated wires supplies a controlled amount of brazing alloy to the joints. This produces consistent braze joints with a volume of braze alloy which is just enough for an optimum joint, while resulting in little or no bleeding into the wick. An advantage of using metal slugs as support pedestals, is that the bottom and/or top plate can be very thin. Conversely, if the plates are made thicker, the metal slugs may be reduced in number or eliminated.

Other objects and features of the present invention will become apparent from the following detailed description considered in conjunction with the accompanying drawings. It is to be understood, however, that the drawings are designed solely for purposes of illustration and not as a definition of the limits of the invention, for which reference should be made to the appended claims. It should be further understood that the drawings are not necessarily drawn to scale and that, unless otherwise indicated, they are merely intended to conceptually illustrate the structures and procedures described herein.

BRIEF DESCRIPTION OF THE DRAWINGS

FIGS. 6A to 6E are exploded perspective views of alternative plate configurations.

DETAILED DESCRIPTION OF THE PRESENTLY PREFERRED EMBODIMENTS

Figure 1:
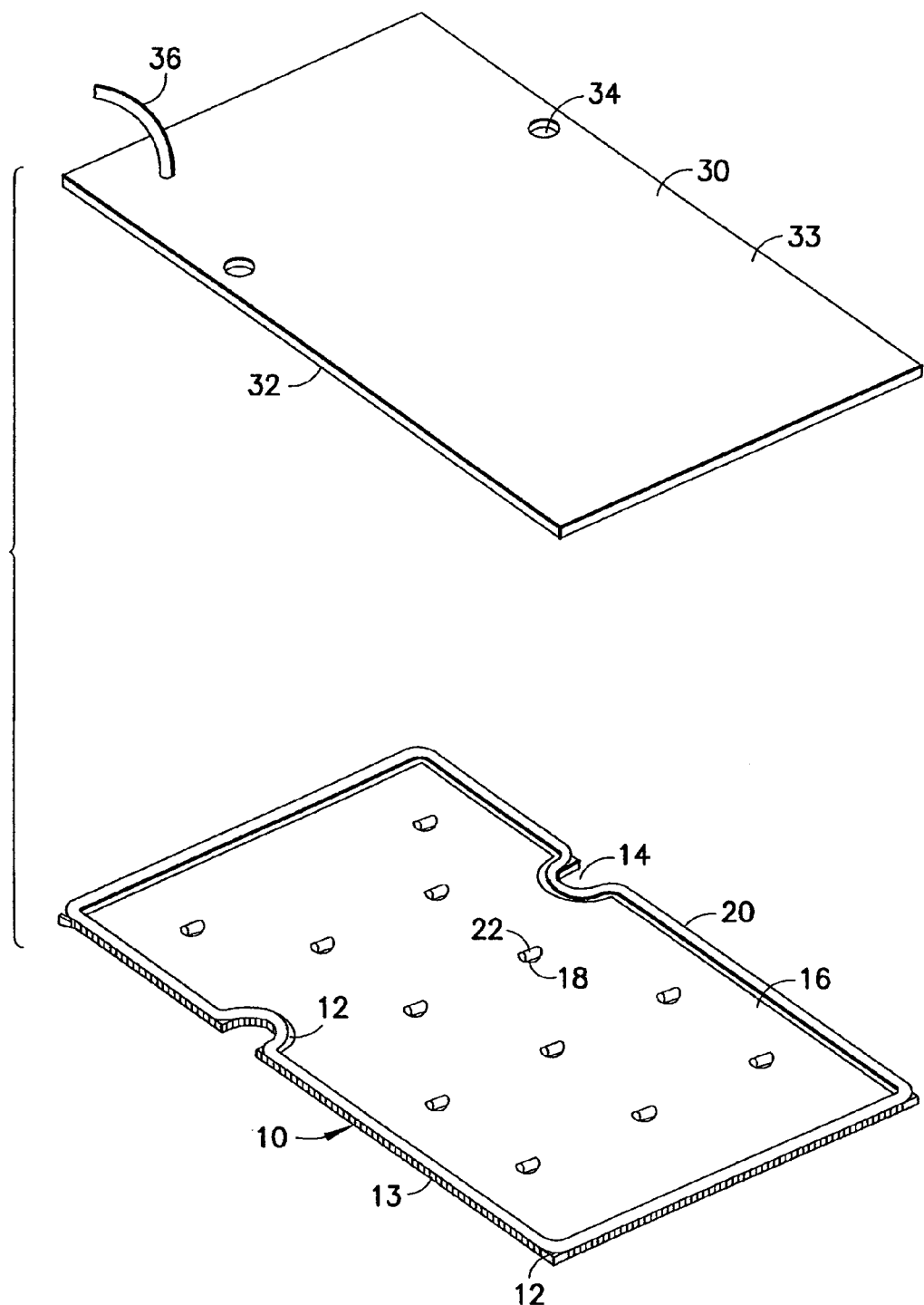
FIG. 1 is exploded perspective of a two-phase cooling plate according to the invention.

FIG. 1 shows a bottom plate 10 having an internal surface 12 to which a wicking structure 16 of open pore copper foam is diffusion bonded, an opposed surface 13, and a pair of laterally opposed notches 14 in the periphery. A wire 20 is formed into a circuit which is placed against the internal surface 12 proximate to the periphery of the bottom plate 10, the structure 16 being spaced from the wire wall 20 to form a gap so that brazing alloy will not bleed into the wick structure. The wire may have any outside cross-section, e.g. circular, oval, square, rectangular, triangular, trapezoidal or rhomboidal, so long as it has a uniform dimension transverse to the internal surface 12. The round cross-section is preferable from the standpoint of commercial availably as wire, ease in bending to any desired shaped, and maintaining the spacing of the plates. In lieu of solid wire, a tubular material having one of a variety of outside cross-sections may also be used. Wire slugs 22 are placed against the internal surface 12 to form pedestals which support a top plate 30, the wick structure 16 being provided with holes 18 providing a gap around each of the slugs 22 to prevent bleeding of the brazing alloy into the wicking structure. While the slugs preferably also have a round cross-section, other cross-sections may be used. Advantageously, the slugs 22 may be formed to have an L-shape or other profile which prevents rolling prior to being brazed to the plates. Both the wire 20 and the slugs 22 are plated with a brazeable alloy. Typically, the plates 10, 30 are made of copper, and the wire 20 and slugs 22 consist of a copper core plated with silver. The top plate 30 has an internal surface 32 which faces the internal surface 12 of the bottom plate 10, an opposed surface 33 to which an inlet tube 36 is brazed over an aperture, and holes 34 which align with notches 14 in the bottom plate to receive mounting screws.

Figure 2A:
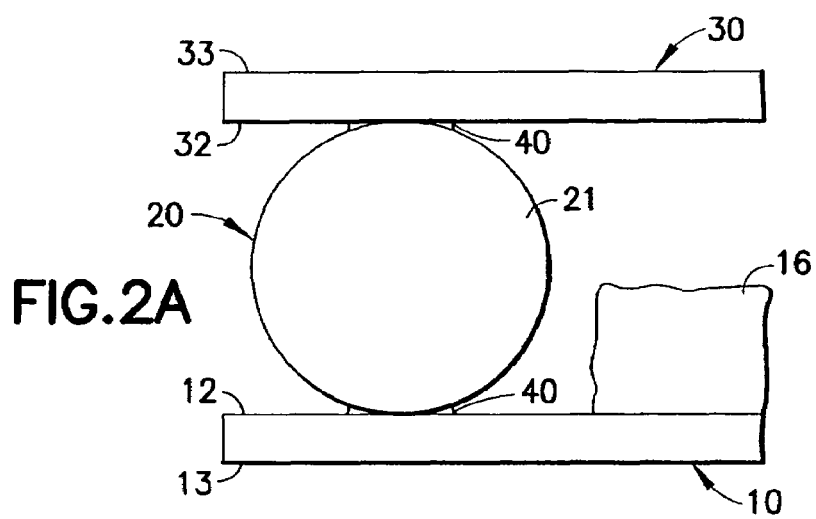
FIG. 2A is a cross-section of a wire which is sandwiched between and brazed to a pair of metal plates.

To complete the assembly, the top plate 30 is placed against the wire wall 20 and the slugs 22, and the assembly is heated until the brazeable alloy melts to form brazed joints between the wire wall 20 and each of the plates 10, 30, as well as between each of the slugs 22 and each of the plates 10, 30. As illustrated in FIG. 2A, the silver alloy 40 forms filleted joints between the wire core 21 and each of the internal surfaces 12, 32 of the respective plates 10, 30. The brazed joints between the slugs 22 and the surfaces 12, 32 have a similar appearance, the plated wire used for the wall 20 being substantially identical to the plated wire used for the slugs 22. Both the wire wall 20 and the slugs 22 are cut from wire which is plated prior to cutting. This is feasible because the end surfaces of the slugs 22 do not form any joints. However the wire wall 20 may require small amounts of brazeable alloy to be provided in the region of the unplated cut ends. The wires may also be plated with a eutectic solder such as PbSn to enable soldering in lieu of brazing. The ends of wire 20 can also be welded, swaged, overlapped, mechanically joined or metallurgically attached using a metal with a higher melting point than the brazing/soldering alloy.

Figure 2B:
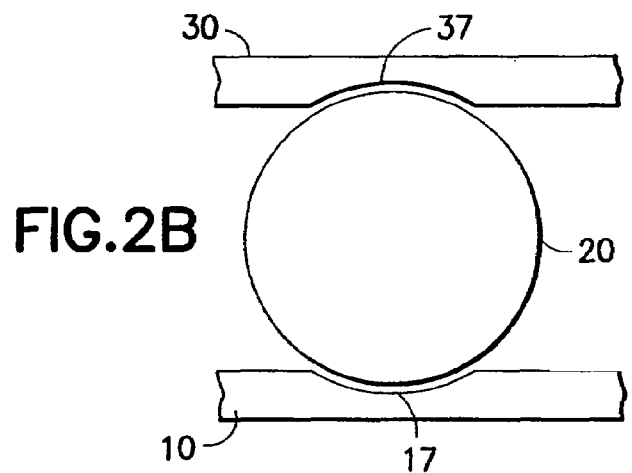
FIG. 2B shows an alternative embodiment wherein the plates are formed with trenches.

FIG. 2B shows an alternative embodiment wherein the plates 10, 30 are embossed or otherwise provided with trenches which are profiled to receive the wire wall 20. While this requires an extra manufacturing step, i.e. forming the trenches, it increases the surface contact between the wire and the plates, and improves the seal when the components are bonded together.

The joining of the plates 10, 30 by brazing or soldering creates a chamber which is accessible via inlet tube 36, but is otherwise sealed. To complete the cooling plate according to the invention, the chamber is partially filled with an evaporable fluid such as water, a vacuum is drawn via the inlet tube, and the tube is pinched off and sealed so that the fluid is present in two phases (liquid and gas). If a boiling-condensing medium other than water is used, e.g. acetone, butane, methanol, or ammonia, other materials may be chosen for the chamber and the wick, e.g. stainless steel, aluminum, or a nickel-based alloy such as Monel for chemical compatibility reasons. The inlet tube 36 may extend far from the plate 30 so that the remote end can be cooled for the purpose of collecting non-condensable gases (NCG), whereupon the tube can be pinched off and sealed closer to the plate 30, thereby eliminating NCG from the final assembly. The slugs 22 serve as support pedestals which prevent the plates 10, 30 from collapsing toward each other as a result of the low pressure in the chamber. Likewise, the brazed joints prevent the plates from expanding away from each other if a positive pressure occurs in the chamber during use.

Figure 3:
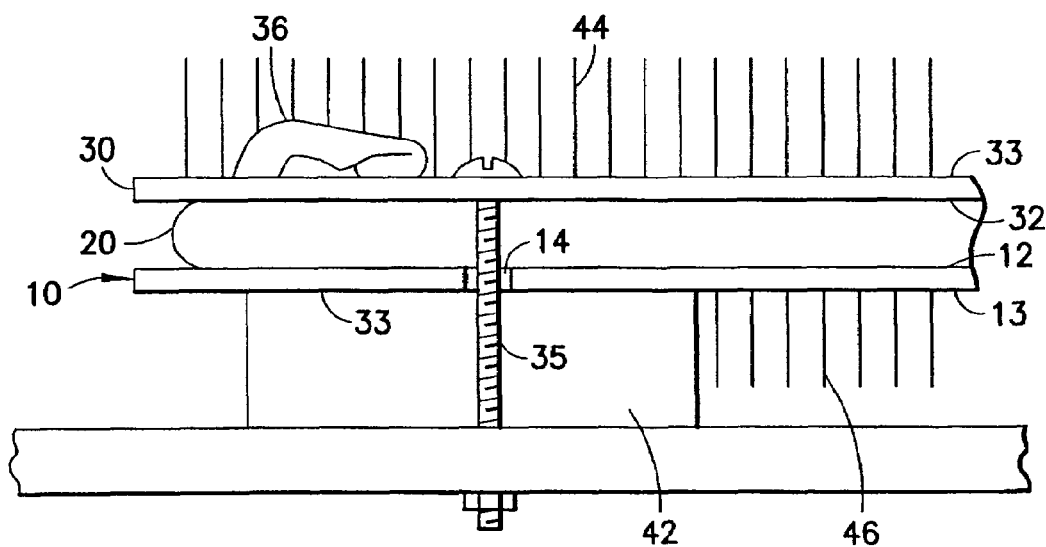
FIG. 3 is an elevation view of the cooling plate assembled to a CPU on a printed circuit board.

In use, the opposed surface 13 of the bottom plate 10 is fixed against an electronic or electrical component 42 to be cooled, such as a central processing unit (CPU), as shown in FIG. 3. This fixing may be accomplished by screws 35 received through the holes 34 and notches 14. Heat generated by the component is transferred through the "footprint" of the component to the bottom plate 10, which causes working fluid adjacent the footprint to evaporate. Evaporation is facilitated by the wicking structure 16, which could be a foam structure, a wire mesh, twisted stranded wires, a grooved surface, a texturized surface, a sintered powder metal or any material offering capillary action, provided it is compatible with the fluid and the other materials of the assembly. It is not essential to provide a wicking structure, but it does promote evaporation, as well as providing a capillary-assisted return path for the condensed fluid. The resulting vapor condenses elsewhere in the chamber, where it is exposed to cooler surfaces. Condensation may be promoted by providing cooling fins 44 on the top plate 30, the cooling fins being interrupted where the inlet tube 36 is folded against the surface 33. It is also possible to provide cooling fins 46 on the surface 13 of the bottom plate 10, adjacent to the footprint of the component 42 being cooled.

Figure 4:
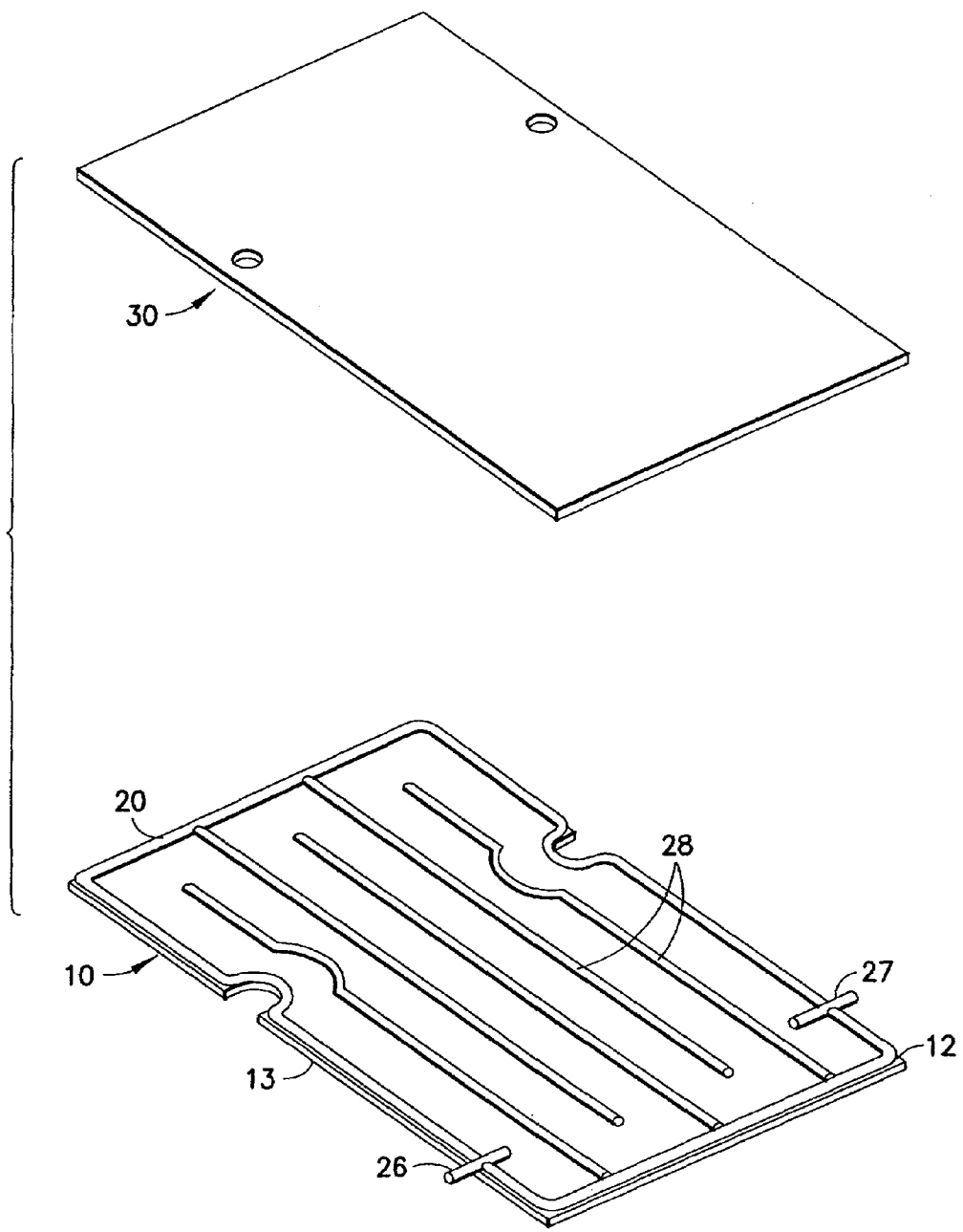
FIG. 4 is an exploded perspective of a single-phase cooling plate according to the invention.

FIG. 4 shows an alternative embodiment of cooling assembly according to the invention, wherein the fluid remains in the liquid phase and is circulated through the assembly via an inlet tube 26 and an outlet tube 27, which are received through the wall 20 and brazed or welded in place. There is no need for a wicking structure, however, structures such as grooves and/or textures may be used to improve heat transfer performance. Instead of slugs which merely support the top plate 30, partitions 28 are provided. These partitions not only support the top plate 30, but direct the liquid on a serpentine route through the chamber to maximize heat transfer. Other routes which prevent dead zones and maximize heat transfer are also possible. The heated liquid is then cooled at a remote heat sink, such as a finned structure (not shown), and pumped back to the cooling assembly. The partitions 28, like the wall 20, may be either a wire (solid core) or a tube (hollow core). The inlet tube 26 and outlet tube 27 are necessarily hollow, and are the same diameter as the wall 20 and partitions 28. Alternatively, the inlet tube 26 and the outlet tube 27 could have a larger diameter than the wall 20, if one of both of the plates is locally deformed to mate with this larger diameter. Of course, the inlet and outlet tubes can enter through either plate, similar to the inlet 36 shown in FIG. 1. All of the wires and/or tubes are plated with brazeable or solderable alloy for bonding and sealing when heated to the melting temperature of the alloy, and result in sealing joints as shown in FIG. 2A. While plating is the preferred method of applying the brazeable or solderable metal, other coating methods such as cladding are also envisioned.

Note that it is not necessary to coat the entire periphery of the wire. In the case of wire having a square profile, for example, it is possible to coat only opposed surfaces of the wire. These may be either the surfaces which contact the respective plates, or the opposed surfaces. This is possible because brazeable or solderable material tends to flow into the contact interface.

In use, the cold plate of FIG. 4 is also fixed against a component such as a CPU, but the requirement for remote cooling and means for circulating the fluid makes the overall system more complex than the evaporative cooling plate of FIG. 1. However the structure of the cooling assembly, insofar as it comprises a chamber formed by two plates and an elongate strip of wire or tubing sandwiched therebetween and bonded thereto, is substantially the same.

In addition to the embodiments of FIGS. 1 and 4, the cooling plate may also be constructed substantially as shown in FIG. 1, but also provided with an outlet for vapor. The vapor is cooled and condensed remotely and pumped back to the chamber as a liquid through the inlet 36. In any of the embodiments, the inlet 36 can be provided through either the wall 20 or one of the plates 10, 30.

Figure 5A:
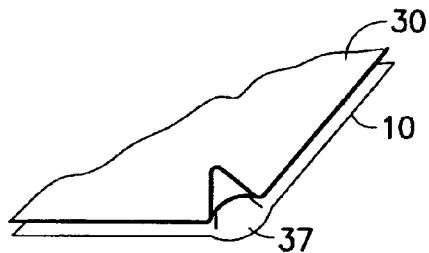
FIGS. 5A and 5B are perspective views of alternative inlets.

FIG. 5A shows an alternative inlet 37 which is formed directly in the plates 10, 30 and communicates with an interruption in the wall 20 (not visible). Following filling and evacuation, the corners of the plates can be cut off, crimped, and soldered to provide a seal, the wall being simultaneously crimped to close the interruption.

Figure 5B:
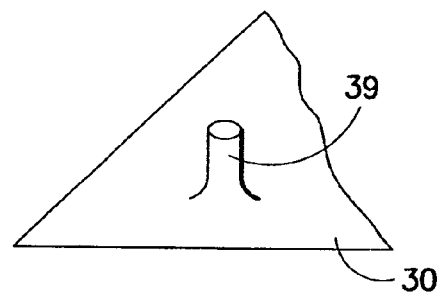

FIG. 5B shows an inlet 39 which is integrally formed with the plate 30 to form a nipple which can be cut off and sealed after adding working fluid and drawing a vacuum.

FIGS. 6A to 6E show alternative cooling plate constructions. More particularly, FIG. 6A shows an alternative cooling plate constructed from two L-shaped members 50, a planar member 51, and a wire or wires 52 bent into the geometry shown. FIG. 6B shows a cooling plate made with two L-shaped members 53 and a wire 54. FIG. 6C shows two C-shaped members 55 and a wire 56 which is formed to be sandwiched between the members 55. FIG. 6D shows two U-shaped members 57 and a wire 58 which is bent to form a circuit sandwiched between the plates 57. FIG. 6E shows a single plate member 59 which is formed to have a narrow U-shaped cross section, and a wire 60 formed which is received against the base of the U to form a circuit enclosing a chamber between the parallel sides. In each of these embodiments, an inlet may be provided according to one of the previously disclosed embodiments.

Figure 7A:
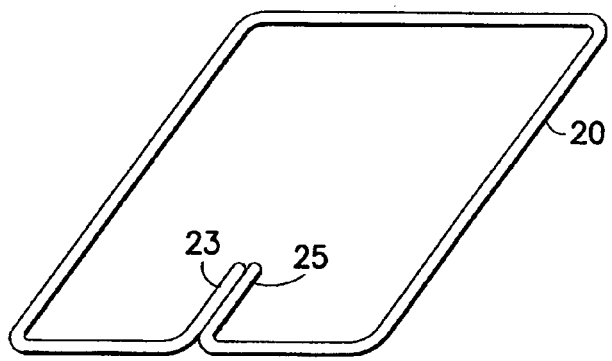
FIGS. 7A and 7B are perspective views of alternative embodiments of the elongate material forming the circuitous wall.
Figure 7B:
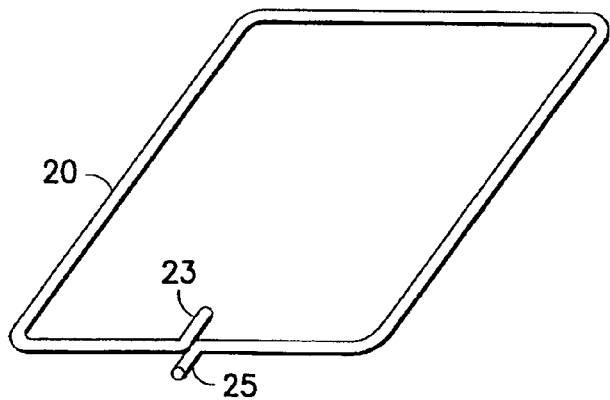

FIG. 7A shows an embodiment of wire 20 having ends 23, 25 which are bent to extend inward in parallel. FIG. 7B shows a tube 20 having ends 23, 25 which are bent to extend oppositely in parallel, thereby forming an inlet for the chamber. This offers the advantage of the elongate material itself being coolable by a fluid flowing therethrough.

Thus, while there have been shown and described and pointed out fundamental novel features of the invention as applied to a preferred embodiment thereof, it will be understood that various omissions and substitutions and changes in the form and details of the devices illustrated, and in their operation, may be made by those skilled in the art without departing from the spirit of the invention. For example, it is expressly intended that all combinations of those elements and/or method steps which perform substantially the same function in substantially the same way to achieve the same results are within the scope of the invention. Moreover, it should be recognized that structures and/or elements and/or method steps shown and/or described in connection with any disclosed form or embodiment of the invention may be incorporated in any other disclosed or described or suggested form or embodiment as a general matter of design choice. It is the intention, therefore, to be limited only as indicated by the scope of the claims appended hereto.

What is claimed:

1. A cooling assembly comprising:
    a first metal plate having an internal surface and an opposed surface;
    a second metal plate having an internal surface and an opposed surface, said internal surface of said second plate facing said internal surface of said first plate and being parallel to said internal surface of said first plate;
    an elongate material consisting of one of a wire and a tube at least partially forming a circuit, said elongate material comprising a core plated with brazeable metal, said elongate material being sandwiched between and bonded to said internal surfaces by brazing to form a chamber;
    an inlet for introducing a fluid into said; and
    a wicking structure in contact with at least one of the internal surfaces for promoting evaporation of said fluid in said chamber.

2. A cooling assembly as in claim 1 wherein said elongate material has a round cross section.

3. A cooling assembly as in claim 2 wherein at least one of said plates has a trench formed in said internal surface, said trench having an arcuate profile which receives said elongate material.

4. A cooling assembly as in claim 1 wherein said core comprises a material which is more electrically or magnetically dissipative than the material of the plates, whereby said core can be heated by exposure to an oscillating electric field or an oscillating magnetic field.

5. A cooling assembly as in claim 4 wherein said metal core is an iron-based core coated with copper, whereby said brazeable metal may be melted by induction heating of said core.

6. A cooling assembly as in claim 1 wherein said inlet is formed by a tube which is received through one of said plates.

7. A cooling assembly as in claim 1 wherein the inlet is formed as a tube which is received through an interruption in the elongate material.

8. A cooling assembly as in claim 1 wherein said chamber contains a fluid which evaporates readily at operating temperatures of a component to be cooled by said assembly.

9. A cooling assembly as in claim 1 further comprising a wicking structure formed integrally with at least one of said internal surfaces.

10. A cooling assembly as in claim 1 further comprising a plurality of spacers sandwiched between and bonded to said internal surfaces in said chamber to prevent deformation of said plates under positive or negative pressure.

11. A cooling assembly as in claim 10 wherein the spacers are slugs of solid wire, said wire being coated with brazeable metal prior to cutting.

12. A cooling assembly as in claim 11 wherein the spacers are formed into a shape which prevents the spacers from rolling when the spacers are placed on a plate prior to bonding.

13. A cooling assembly as in claim 1 further comprising cooling fins fixed to one of said opposed surfaces.

14. A cooling assembly comprising:
a first metal plate having an internal surface and an opposed surface:
a second metal plate having an internal surface and an opposed surface, said internal surface of said second plate facing said internal surface of said first plate and being parallel to said internal surface of said first plate;
an elongate material consisting of one of a wire and a tube at least partially forming a circuit, said elongate material comprising a core plated with brazeable metal, said elongate material being sandwiched between and bonded to said internal surfaces by brazing to form a chamber; and
an inlet for introducing a fluid into said chamber; wherein said core is copper and said brazeable metal is silver.

15. The cooling assembly of claim 14 wherein said first and second plates are made of copper.

16. The cooling assembly of claim 14 wherein said elongate material is bonded to said plates at filleted joints formed by a silver alloy.

17. A cooling assembly comprising:
a first metal plate having an internal surface and an opposed surface;
a second metal plate having an internal surface and an opposed surface, said internal surface of said second plate facing said internal surface of said first plate and being parallel to said internal surface of said first plate;
an elongate material consisting of one of a wire and a tube at least partially forming a circuit, said elongate material being sandwiched between and bonded to said internal surfaces to form a chamber;
an inlet for introducing a fluid into said chamber; and
a plurality of spacers sandwiched between and bonded to said internal surfaces in said chamber to prevent deformation of said plates under positive or negative pressure;
wherein the spacers comprise slugs of solid wire, said wire being coated with brazeable metal prior to cutting.

18. A cooling assembly as in claim 17 wherein the spacers are formed into a shape which prevents the spacers from rolling when the spacers are placed on a plate prior to bonding.

19. A cooling assembly as in claim 17 wherein said elongate material has a round cross section.

20. A cooling assembly as in claim 19 wherein at least one of said plates has a trench formed in said internal surface, said trench having an arcuate profile which receives said elongate material.

21. A cooling assembly as in claim 17 wherein said core comprises a material which is more electrically or magnetically dissipative than the material of the plates, whereby said core can be heated by exposure to on oscillating electric field or an oscillating magnetic field.

22. A cooling assembly as in claim 17 wherein said inlet is formed by a tube which is received through one of said plates.

23. A cooling assembly as in claim 17 wherein the inlet is formed as a tube which is received through an interruption in the elongate material.

* * * * *